US011706958B2

(12) United States Patent
Qing et al.

(10) Patent No.: US 11,706,958 B2
(45) Date of Patent: Jul. 18, 2023

(54) DISPLAY PANEL, DISPLAY APPARATUS, METHOD OF PREVENTING ELECTRO-MAGNETIC INTERFERENCE IN DISPLAY PANEL, AND METHOD OF FABRICATING DISPLAY PANEL

(71) Applicants: Chengdu BOE Optoelectronics Technology Co., Ltd., Sichuan (CN); BOE Technology Group Co., Ltd., Beijing (CN)

(72) Inventors: Haigang Qing, Beijing (CN); Tinghua Shang, Beijing (CN); Pengfei Yu, Beijing (CN)

(73) Assignees: BOE Technology Group Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 439 days.

(21) Appl. No.: 17/047,914

(22) PCT Filed: Dec. 17, 2019

(86) PCT No.: PCT/CN2019/125934
§ 371 (c)(1),
(2) Date: Oct. 15, 2020

(87) PCT Pub. No.: WO2021/119991
PCT Pub. Date: Jun. 24, 2021

(65) Prior Publication Data
US 2023/0112912 A1    Apr. 13, 2023

(51) Int. Cl.
*G09G 3/00* (2006.01)
*G09G 3/3208* (2016.01)
(Continued)

(52) U.S. Cl.
CPC ....... *H10K 59/131* (2023.02); *G02F 1/13452* (2013.01); *G09G 3/035* (2020.08);
(Continued)

(58) Field of Classification Search
CPC ....... G09G 2300/0426; G09G 2380/02; G09G 3/3208; G09G 2320/0209; G09G 2330/06;
(Continued)

(56) References Cited

U.S. PATENT DOCUMENTS 9,246,213 B2 *   1/2016   Togashi ............... H01Q 5/378
10,416,513 B2 *   9/2019   Zuo ..................... G09G 3/3688
(Continued)

FOREIGN PATENT DOCUMENTS

CN         103926732 A       7/2014
CN         104752485 A       7/2015
(Continued)

OTHER PUBLICATIONS

International Search Report & Written Opinion dated Sep. 23, 2020, regarding PCT/CN2019/125934.
(Continued)

*Primary Examiner* — Dismery Mercedes
(74) *Attorney, Agent, or Firm* — Intellectual Valley Law, P.C.

(57) ABSTRACT

A display panel is provided. The display panel includes a display part; and a fanout part. The display part includes a plurality of pixel driving circuits. The fanout part includes a bendable portion and a multiplexer. The display panel includes a plurality of first signal lines extending through the bendable portion, and connecting the plurality of pixel driving circuits to the multiplexer. A direct current supply line extending through the bendable portion and electrically connected to the plurality of pixel driving circuits. A portion
(Continued)

of the direct current supply line is between the multiplexer and the bendable portion and crosses over the plurality of first signal lines.

15 Claims, 12 Drawing Sheets

(51) Int. Cl.
- *G02F 1/1345* (2006.01)
- *H10K 59/131* (2023.01)
- *H10K 77/10* (2023.01)

(52) U.S. Cl.
CPC ......... *G09G 3/3208* (2013.01); *H10K 77/111* (2023.02); *G09G 2300/0426* (2013.01); *G09G 2330/06* (2013.01)

(58) Field of Classification Search
CPC ........... G09G 3/035; G09G 2310/0297; H10K 77/111; H10K 59/131; H10K 2102/311; H10K 50/844; H10K 59/179; H10K 2102/341

See application file for complete search history.

(56) References Cited

U.S. PATENT DOCUMENTS

| | | | |
|---|---|---|---|
| 10,622,082 B2* | 4/2020 | Wang | G09G 3/3266 |
| 10,644,091 B2* | 5/2020 | Liu | H10K 71/00 |
| 11,126,045 B2* | 9/2021 | Chen | G02F 1/133305 |
| 2001/0033355 A1* | 10/2001 | Hagiwara | H05K 3/361 349/152 |
| 2010/0182207 A1* | 7/2010 | Miyata | H01Q 1/364 343/702 |
| 2015/0187279 A1 | 7/2015 | Lee et al. | |
| 2015/0294987 A1 | 10/2015 | Xia et al. | |
| 2017/0287936 A1 | 10/2017 | Kim et al. | |
| 2017/0288008 A1* | 10/2017 | Kim | G09G 3/3258 |
| 2017/0337860 A1* | 11/2017 | Yi | G09G 3/3648 |
| 2018/0033979 A1 | 2/2018 | Jang et al. | |
| 2018/0040596 A1* | 2/2018 | Chang | H01L 23/373 |
| 2018/0123060 A1* | 5/2018 | Jang | H10K 77/111 |
| 2018/0284922 A1* | 10/2018 | Teranishi | G06F 3/0412 |
| 2018/0337226 A1 | 11/2018 | Liu et al. | |
| 2019/0318681 A1 | 10/2019 | Zhang et al. | |
| 2020/0193887 A1* | 6/2020 | Wu | G09G 3/20 |

FOREIGN PATENT DOCUMENTS

| | | |
|---|---|---|
| CN | 106847151 A | 6/2017 |
| CN | 109326628 A | 2/2019 |
| CN | 109523949 A | 3/2019 |

OTHER PUBLICATIONS

Extended European Search Report in the European Patent Application No. 19945446.3, dated Dec. 16, 2022.

* cited by examiner

US 11,706,958 B2

DISPLAY PANEL, DISPLAY APPARATUS, METHOD OF PREVENTING ELECTRO-MAGNETIC INTERFERENCE IN DISPLAY PANEL, AND METHOD OF FABRICATING DISPLAY PANEL

CROSS-REFERENCE TO RELATED APPLICATION

This application is a national stage application under 35 U.S.C. § 371 of International Application No. PCT/CN2019/125934, filed Dec. 17, 2019, the contents of which are incorporated by reference in the entirety.

TECHNICAL FIELD

The present invention relates to display technology, more particularly, to a display panel, a display apparatus, a method of preventing electro-magnetic interference in a display panel, and a method of fabricating a display panel.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD apparatus. Nowadays, Active Matrix Organic Light Emitting Diodes (AMOLED) technology as one of the OLED display technologies becomes popular in the display technology field.

SUMMARY

In one aspect, the present invention provides a display panel, comprising a display part; and a fanout part; wherein the display part comprises a plurality of pixel driving circuits; the fanout part comprises a bendable portion and a multiplexer; wherein the display panel comprises a plurality of first signal lines extending through the bendable portion, and connecting the plurality of pixel driving circuits to the multiplexer; and a direct current supply line extending through the bendable portion and electrically connected to the plurality of pixel driving circuits; and wherein a portion of the direct current supply line is between the multiplexer and the bendable portion and crosses over the plurality of first signal lines.

Optionally, the fanout part comprises a first fanout sub-part abutting the display part; the bendable portion connected to the first fanout sub-part and spaced apart from the display part by the first fanout sub-part; a second fanout sub-part connected to the bendable portion and spaced apart from the first fanout sub-part by the bendable portion; and the multiplexer connected to the second fanout sub-part and spaced apart from the bendable portion by the second fanout sub-part.

Optionally, the display panel further comprises a driving integrated circuit; wherein the fanout part further comprises a third fanout sub-part connected to the multiplexer and spaced apart from the second fanout sub-part by the multiplexer; and wherein the display panel comprises a plurality of second signal lines extending through the third fanout sub-part, and connecting the multiplexer to the driving integrated circuit.

Optionally, the direct current supply line comprises a first portion, a second portion, and a third portion; the first portion crosses over the plurality of first signal lines; the second portion extends from the first portion through the bendable portion to electrically connect to the plurality of pixel driving circuits; and the third portion connects the first portion to a flexible printed circuit.

Optionally, the first portion of the direct current supply line is in a region corresponding to the second fanout sub-part; the second portion of the direct current supply line extends over a portion of the second fanout sub-part, and extends through the bendable portion and a region corresponding to the first fanout sub-part; and the plurality of first signal lines extend through the first fanout sub-part, the bendable portion, and the second fanout sub-part.

Optionally, a total number of the plurality of second signal lines is less than a total number of the plurality of first signal lines.

Optionally, the direct current supply line is selected from a group consisting of a high voltage power supply line configured to provide a high voltage signal to the plurality of pixel driving circuits, a low voltage power supply line configured to provide a low voltage signal to the plurality of pixel driving circuits, and an initialization signal line configured to provide an initialization signal to the plurality of pixel driving circuits.

Optionally, the display panel further comprises an antenna; wherein the direct current supply line spaces apart the multiplexer and the antenna.

Optionally, the display panel further comprises a plurality of driving thin film transistor respectively in a plurality of subpixels in the display part; wherein a respective one of the plurality of driving thin film transistors comprises a driving active layer, a driving source electrode, a driving drain electrode, and a driving gate electrode; and the driving source electrode, the driving drain electrode, the first portion, the second portion, and the third portion are in a same layer and comprise a same material.

Optionally, the display panel further comprises a plurality of capacitors respectively in the plurality of subpixels in the display part; wherein a respective one of the plurality of capacitors comprises a first capacitor electrode, a second capacitor electrode, and an insulating layer insulating the first capacitor electrode from the second capacitor electrode; wherein the plurality of first signal lines comprises a plurality of first type first signal lines and a plurality of second type first signal lines; orthographic projections of the plurality of first type first signal lines on a base substrate and orthographic projections of the plurality of second type first signal lines on the base substrate are alternately arranged; the first capacitor electrode, the driving gate electrode, and the plurality of first type first signal lines are in a same layer and comprise a same material; and the second capacitor electrode, and the plurality of second type first signal lines are in a same layer and comprise a same material.

Optionally, the plurality of second signal lines comprise a plurality of first type second signal lines and a plurality of second type second signal lines; orthographic projections of the plurality of first type second signal lines on the base substrate and orthographic projections of the plurality of second type second signal lines on the base substrate are alternately arranged; the first capacitor electrode, the driving gate electrode, the plurality of first type first signal lines, and the plurality of first type second signal lines are in a same layer and comprise a same material; and the second capacitor electrode, the plurality of second type first signal lines, and the plurality of second type second signal lines are in a same layer and comprise a same material.

Optionally, the multiplexer comprises a plurality of multiplexer sub-units; a respective one of the plurality of multiplexer sub-units comprises a first source electrode, a first gate electrode, a first drain electrode, a second gate electrode, a second drain electrode, and an active layer; the first source electrode, the first drain electrode, the second drain electrode, the driving source electrode, the driving drain electrode, the first portion, the second portion, and the third portion are in a same layer and comprise a same material; and the first gate electrode, the second gate electrode, and the driving gate electrode are in a same layer and comprise a same material.

Optionally, the direct current supply line further comprises a fourth portion in the first fallout sub-part; the first portion is between the fourth portion and the multiplexer; the first portion and the fourth portion are spaced apart by the bendable portion; the first portion crosses over the plurality of first signal lines in the second fanout sub-part; and the fourth portion crosses over the plurality of first signal lines in the first fanout sub-part.

Optionally, the display panel further comprises a plurality of direct current lines respectively connected to the fourth portion; wherein the plurality of direction current lines respectively extend along a direction from the fanout part to the display part to respectively connect to a column of a plurality of subpixels in the display part; and the first portion, the second portion, the third portion, the fourth portion and the plurality of direct current lines are in a same layer and comprise a same material.

In another aspect, the present invention provides a display apparatus, comprising the display panel described herein or fabricated by a method described herein, and one or more integrated circuits connected to the display panel In another aspect, the present invention provides a method of preventing electro-magnetic interference in a display panel; wherein the display panel comprises a display part and a fanout part; wherein the display part comprises a plurality of pixel driving circuits; the fallout part comprises a bendable portion and a multiplexer; wherein the display panel comprises a plurality of first signal lines extending through the bendable portion, and connecting the plurality of pixel driving circuits to the multiplexer; and a direct current supply line extending through the bendable portion and electrically connected to the plurality of pixel driving circuits; wherein a portion of the direct current supply line is between the multiplexer and the bendable portion and crosses over the plurality of first signal lines; wherein the method of preventing electro-magnetic interference comprises providing a direct current signal to the direct current supply line to prevent electromagnetic radiation signals emitted from the multiplexer from transmitting to the bendable portion.

Optionally, the direct current signal is selected from a group consisting of a high voltage signal provided to the plurality of pixel driving circuits, a low voltage signal provided to the plurality of pixel driving circuits, and an initialization signal provided to the plurality of pixel driving circuits; and the direct current supply line is selected from a group consisting of a high voltage power supply line configured to provide the high voltage signal to the plurality of pixel driving circuits, a low voltage power supply line configured to provide the low voltage signal to the plurality of pixel driving circuits, and an initialization signal line configured to provide the initialization signal to the plurality of pixel driving circuits.

Optionally, the display panel further comprises an antenna; wherein the direct current supply line spaces apart the multiplexer and the antenna; and providing the direct current signal to the direct current supply line prevents the electromagnetic radiation signals emitted from the multiplexer from transmitting to the antenna.

In another aspect, the present invention provides a method of fabricating a display panel, comprising forming a plurality of pixel driving circuits in a display part; forming a bendable portion in a fanout part; forming a multiplexer in the fanout part; forming a plurality of first signal lines extending through the bendable portion, and connecting the plurality of pixel driving circuits to the multiplexer; and forming a direct current supply line extending through the bendable portion and be electrically connected to the plurality of pixel driving circuits; wherein a portion of the direct current supply line is formed between the multiplexer and the bendable portion and crossing over the plurality of first signal lines.

Optionally, the method further comprises forming an antenna; wherein the antenna is formed at a position spaced apart from the multiplexer by the direct current supply line.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

AMOLED display apparatuses having various shapes have been fabricated. In order to accommodate different shapes of the display apparatus, a multiplexer (MUX) has been used to reduce the total number of the PINs for connecting the integrated circuit IC to a bendable part of a display substrate in the display apparatus. In some display apparatuses, a MUX can be disposed in the back panel of the display apparatuses. In doing so, the MUX is inevitably disposed at a location relatively close to an antenna of the display apparatus (e.g., an antenna of a mobile phone). Proximity between the MUX and the antenna may cause an electro-magnetic interference to the antenna of the display apparatus, resulting in a relatively poor communication performance.

Accordingly, the present disclosure provides, inter alia, a display panel, a display apparatus, a method of preventing electro-magnetic interference in a display panel, and a method of fabricating a display panel that substantially obviate one or more of the problems due to limitations and disadvantages of the related art. In one aspect, the present disclosure provides a display panel. In some embodiments, the display panel includes a display part; and a fanout part. Optionally, the display part includes a plurality of pixel driving circuits. Optionally, the fanout part includes a bendable portion; and a multiplexer. Optionally, the display panel includes a plurality of first signal lines extending through the bendable portion and connecting the plurality of pixel driving circuits to the multiplexer; and a direct current supply line extending through the bendable portion and electrically connected to the plurality of pixel driving circuits. Optionally, a portion of the direct current supply line is between the multiplexer and the bendable portion and crosses over the plurality of first signal lines.

Figure 1:
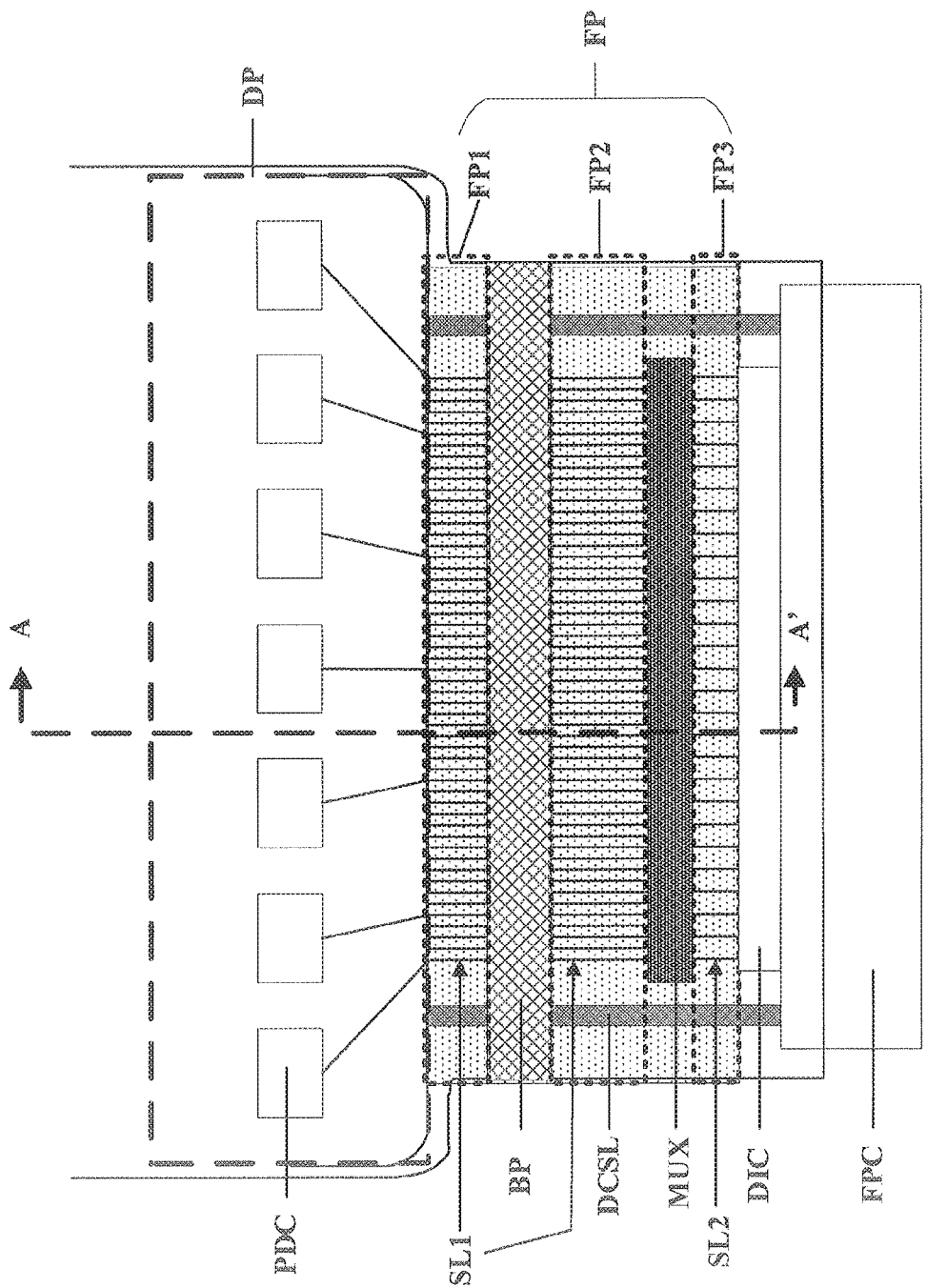
FIG. 1 is a schematic diagram of a structure of a display panel in some embodiments according to the present disclosure.

FIG. 1 is a schematic diagram of a structure of a display panel in some embodiments according to the present disclosure. The display panel in FIG. 1 is in an extended state, e.g., without being bent. In some embodiments, referring to FIG. 1, the display panel includes a display part DP and a fanout part FP. Optionally, the fanout part FP is a portion of a peripheral part of the display panel.

As used herein, the term "display part" refers to a part of the display substrate where image is actually displayed. Optionally, the display part may include both a subpixel region and an inter-subpixel region. A subpixel region refers to a light emission region of a subpixel, such as a region corresponding to a pixel electrode in a liquid crystal display or a region corresponding to a light emissive layer in an organic light emitting display. An inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels.

As used herein the term "peripheral part" refers to a part of a display substrate e.g., an opposing substrate or an array substrate) in a display panel where various circuits and wires are provided to transmit signals to the display substrate. To increase the transparency of the display apparatus, non-transparent or opaque components of the display apparatus (e.g., battery, printed circuit board, metal frame), can be disposed in the peripheral part rather than in the display part. For example, the fanout part is the portion of peripheral part having various circuits and wires disposed thereon.

Optionally, the display part includes a plurality of pixel driving circuits PDC. For example, the plurality of pixel driving circuits PDC are configured to driving the plurality of subpixels in the display part DP.

Figure 2:
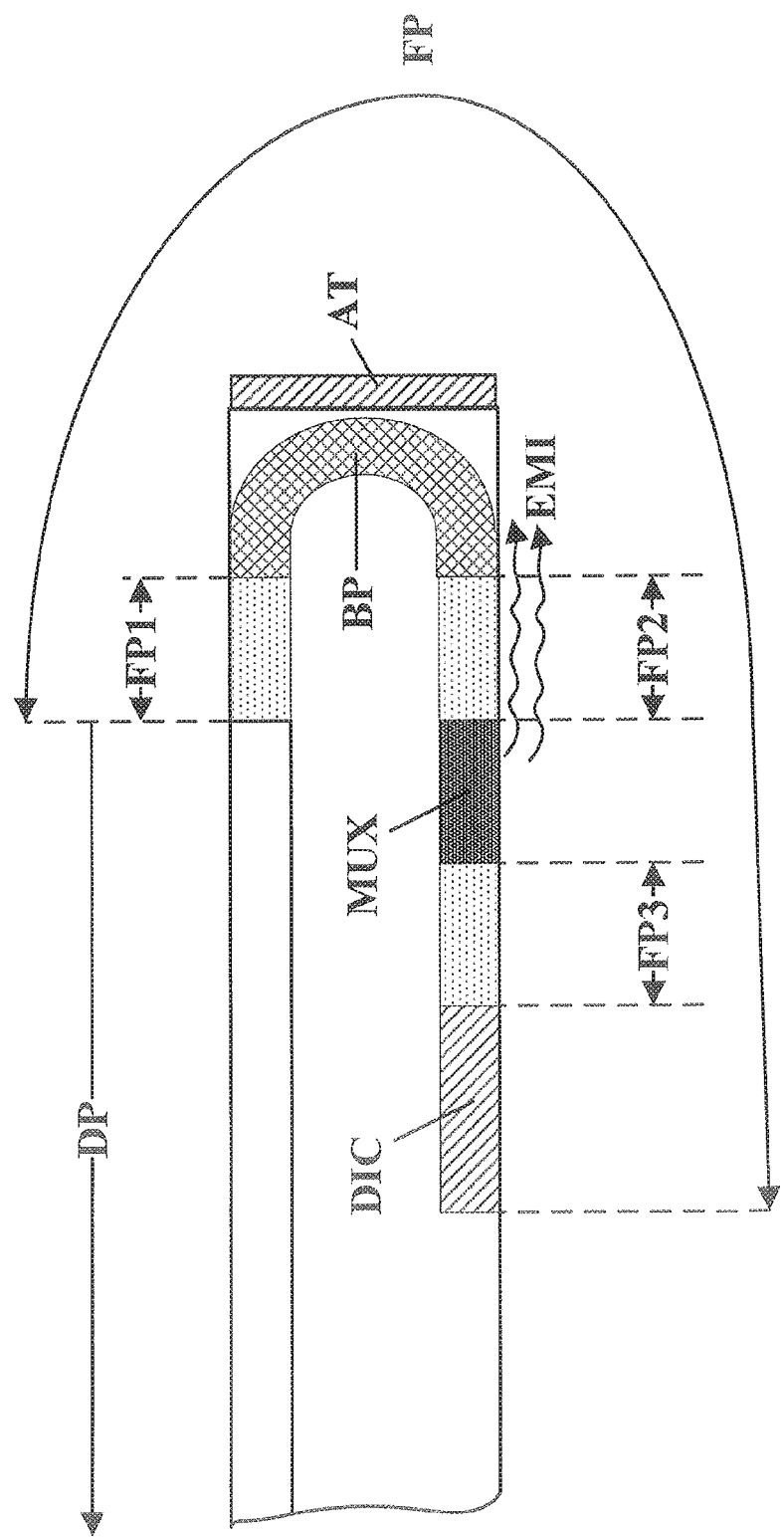
FIG. 2 is a cross-sectional view of the display panel along an A-A' line in FIG. 1 and when the display panel is bent at the bendable portion.

FIG. 2 is a cross-sectional view of the display panel along an A-A' line in FIG. 1 and when the display panel is bent at the bendable portion. Optionally, referring to FIG. 1 and FIG. 2, the fanout part FP includes a bendable portion BP (FIG. 2 shows a structure of the display panel bent at the bendable portion BP), and a multiplexer MUX. Optionally, the display panel includes a plurality of first signal lines SL1 extending through the bendable portion BP, and connecting the plurality of pixel driving circuits PDC to the multiplexer MUX; and a direct current supply line DCSL extending through the bendable portion BP, electrically connected to the plurality of pixel driving circuits PDC, and electrically connected to a flexible printed circuit FPC. Optionally, a direct current signal is transmitted through the direct current supply line DCSL. As used herein, the term "extending through" means that completely penetrate through.

Optionally, the plurality of first signal lines SL1 are a plurality of signal lines respectively connected to a plurality of data lines in the display part. Optionally, the plurality of first signal lines SL1 are a plurality of signal lines respectively connected to a plurality of gate lines in the display part. Optionally, the plurality of first signal lines SL1 are a plurality of signal lines respectively connected to a plurality of touch signal lines (e.g., touch scanning signal lines or touch sensing signal lines) in the display part.

In some embodiments, the fanout part FP includes a first fanout sub-part FP1 abutting the display part DP; the bendable portion BP connected to the first fanout sub-part FP1 and spaced apart from the display part DP by the first fanout sub-part FP1; a second fanout sub-part FP2 connected to the bendable portion BP and spaced apart from the first fanout sub-part FP1 by the bendable portion BP; and the multiplexer MUX connected to the second fanout sub-part FP2 and spaced apart from the bendable portion BP by the second fanout sub-part FP2. Optionally, the first fanout sub-part FP1 connects the display part DP with the bendable portion BR Optionally, the bendable portion BP connects the first fanout sub-part FP1 with the second fanout sub-part FP2. Optionally, the second fanout sub-part FP2 connects the bendable portion BP with the multiplexer MUX.

In some embodiments, the display panel further includes a driving integrated circuit DIC. Optionally, the fanout part FP further includes a third fanout sub-part FP3 connected to the multiplexer MUX and spaced apart from the second fanout sub-part FP2 by the multiplexer MUX. Optionally, the display panel includes a plurality of second signal lines SL2 extending through the third fanout sub-part FP3, and connecting the multiplexer MUX to the driving integrated circuit DIC. Optionally, the multiplexer MUX connects the second fanout sub-part FP2 with the third fallout sub-part FP3.

The fanout part (e.g., including the first fanout sub-part FP1, the second fallout sub-part FP2, and the third fanout sub-part FP3) described herein should be understood to mean a portion of the display panel excluding the plurality of first signal lines, the direct current supply line, and the plurality of second signal lines.

In some embodiments, referring to FIG. 1, the direct current supply line DCSL extends though the fanout part FP and connects the flexible printed circuit FPC with the plurality of pixel driving circuits PDC.

In some embodiments, referring to FIG. 2, the display panel further includes an antenna AT. The AT can be at any position proximate to edges of the bendable portion BP. Optionally, the multiplexer MUX and the antenna AT are spaced apart from each other by the second fanout sub-part FP2. The multiplexer MUX is configured to reduce a number of signal lines connected to the driving integrated circuit DIC. For example, the plurality of first signal lines SL1 are grouped into a plurality of groups of first signal lines, a respective group of the plurality of groups of first signal lines includes two or more first signal lines of the plurality of first signal lines SL1. A total number of groups of the plurality of groups of first signal lines is equivalent to a total number of the plurality of second signal lines SL2. The multiplexer MUX is configured to switch one of the two or more first signal lines in the respective one group of the plurality of groups of first signal lines to the respective one of the plurality of second signal lines SL2. Because signals transmitted by the two or more first signal lines in the respective one group of the plurality of groups of first signal lines are different, and due to alternately switching between the two or more first signal lines, electro-magnetic radiation signals emitted by the multiplexer MUX may be propagated to the bendable portion BP through the second fanout sub-part FP2. In turn, the electro-magnetic radiation signals transmitted to the bendable portion BP may interfere signals to be received by or transmitted from the antenna AT, leading to electro-magnetic interference EM1 having an adverse effect on the communication ability of the antenna.

Figure 3:
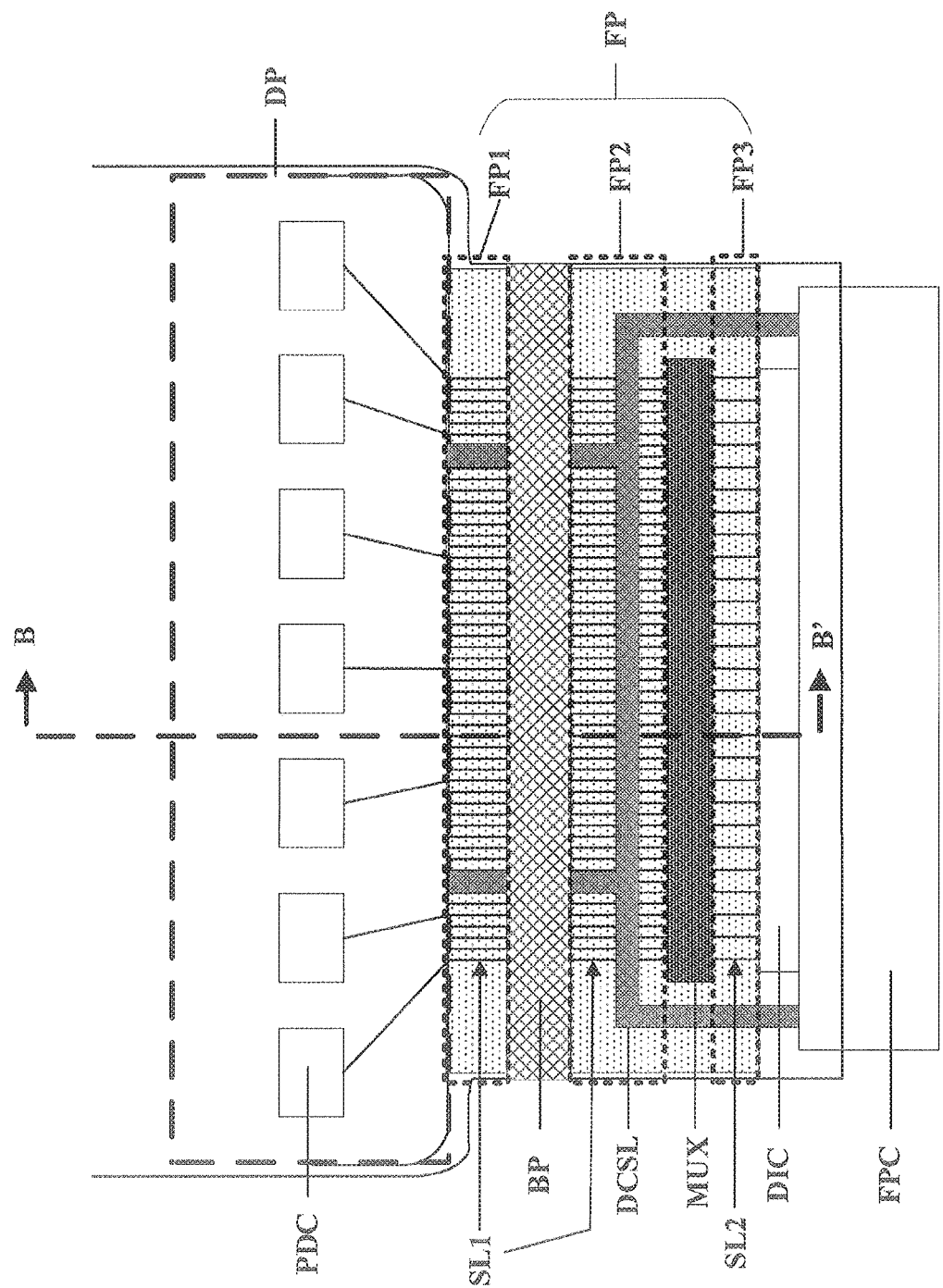
FIG. 3 is a schematic diagram of a structure of a display panel in some embodiments according to the present disclosure.
Figure 4:
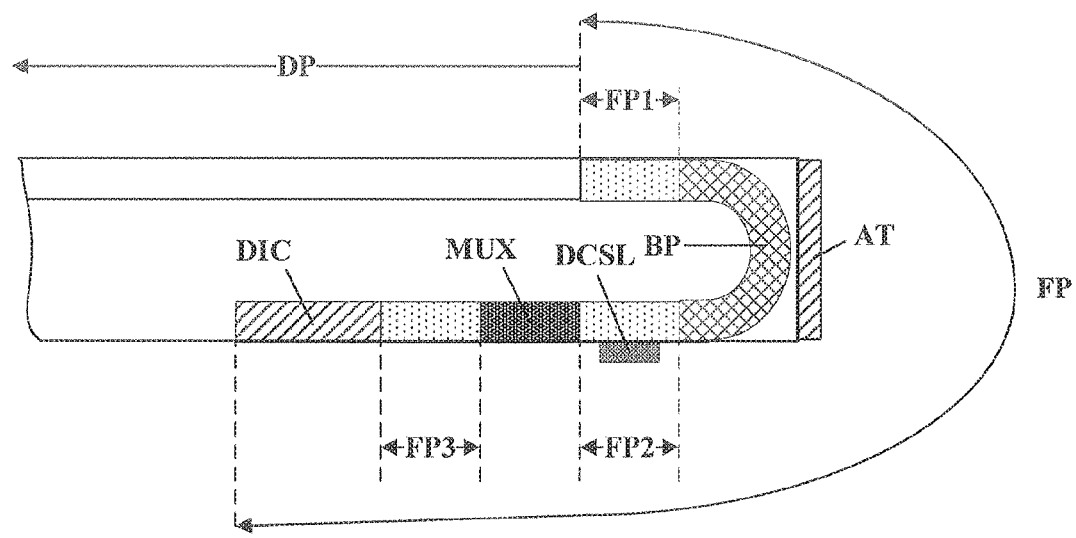
FIG. 4 is a cross-sectional view of the display panel along a B-B' line in FIG. 3 and when the display panel is bent at the bendable portion.

FIG. 3 is a schematic diagram of a structure of a display panel in some embodiments according to the present disclosure. The display panel in FIG. 3 is in an extended state, e.g., without being bent. FIG. 4 is a cross-sectional view of the display panel along a B-B' line in FIG. 3 and when the display panel is bent at the bendable portion. FIG. 4 shows the display panel bent at the bendable portion BP. The bendable portion BP has a Young's modulus smaller than Young's moduli of other parts of the display panel, e.g., smaller than a Young's modulus of the display part DP, a Young's modulus of the first fanout sub-part FP1, a Young's modulus of the second fanout sub-part FP2, or a Young's modulus of the third fanout sub-part FP3. Optionally, the bendable portion BP has a Young's modulus in a range of 0.0001 GPa to 20 Gpa, e.g., 0.0001 GPa to 0.5 GPa, 0.5 GPa to 2.0 GPa, 2.0 GPa to 10 GPa, or 10 GPa to 20 GPa.

Figure 5:
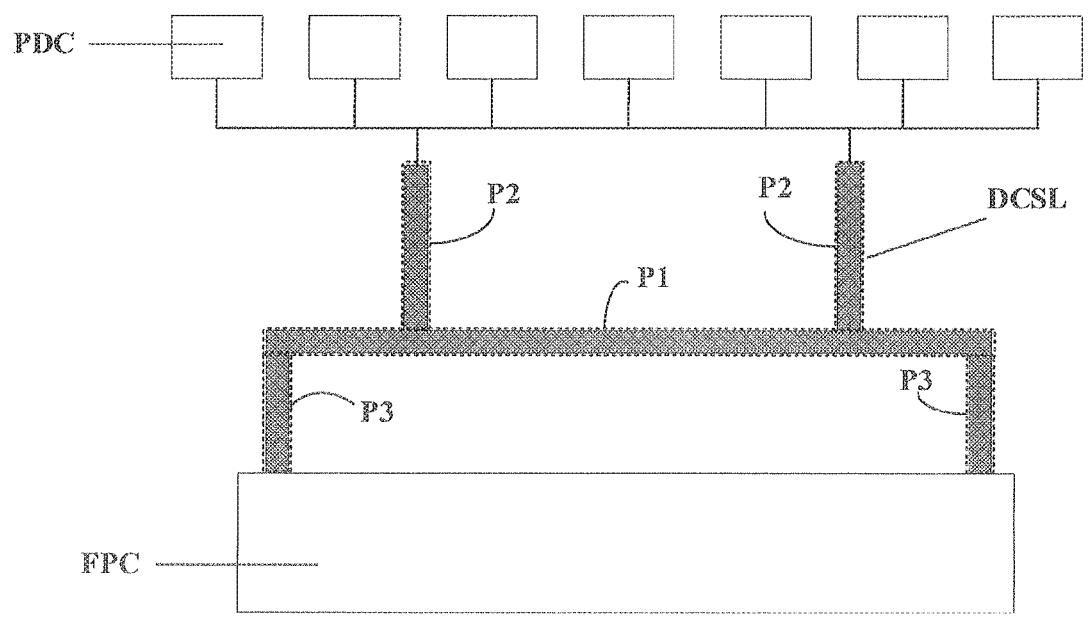
FIG. 5 is a schematic diagram of a structure of a direct current supply line in some embodiments according to the present disclosure.

In some embodiments, referring to FIG. 3 and FIG. 4, a portion of the direct current supply line DCSL is between the multiplexer MUX and the bendable portion BP, and crosses over the plurality of first signal lines SL1. FIG. 5 is a schematic diagram of a structure of a direct current supply line in some embodiments according to the present disclosure. In some embodiments, referring to FIG. 3 to FIG. 5, the direct current supply line DCSL includes a first portion P1, a second portion P2, and a third portion P3. Optionally, the first portion P1 crosses over the plurality of first signal lines SL1. Optionally, the second portion P2 extends from the first portion P1 through the bendable portion BP to electrically connect to the plurality of pixel driving circuits PDC (e.g., through signal lines in the display part). For example, a sub-portion of the second portion P2 in a region corresponding to the bendable portion BP has a mesh structure. Optionally, the third portion P3 connects the first portion P1 to the flexible printed circuit FPC. Optionally, the first portion P1, the third portion P3, and the driving circuit DIC form a shape surrounding the peripheral of the multiplexer MUX.

Optionally, the second portion P2 extends along a direction substantially perpendicular to a direction along which the first portion P1 extends. Optionally, the third portion P3 extends along a direction substantially perpendicular to a direction along which the first portion P1 extends. Optionally, the second portion P2 and the third portion P3 are substantially parallel to each other.

Optionally, an orthographic projection of the second portion P2 on the plurality of first signal lines SL1 covers a portion of the plurality of first signal lines SL1. Optionally, an orthographic projection of the third portion P3 on the plurality of first signal lines SL1 is non-overlapping with the plurality of first signal lines SL1. Optionally, the orthographic projection of the third portion P3 on the plurality of first signal lines SL1 is non-overlapping with the plurality of second signal lines SL2.

Figure 6:
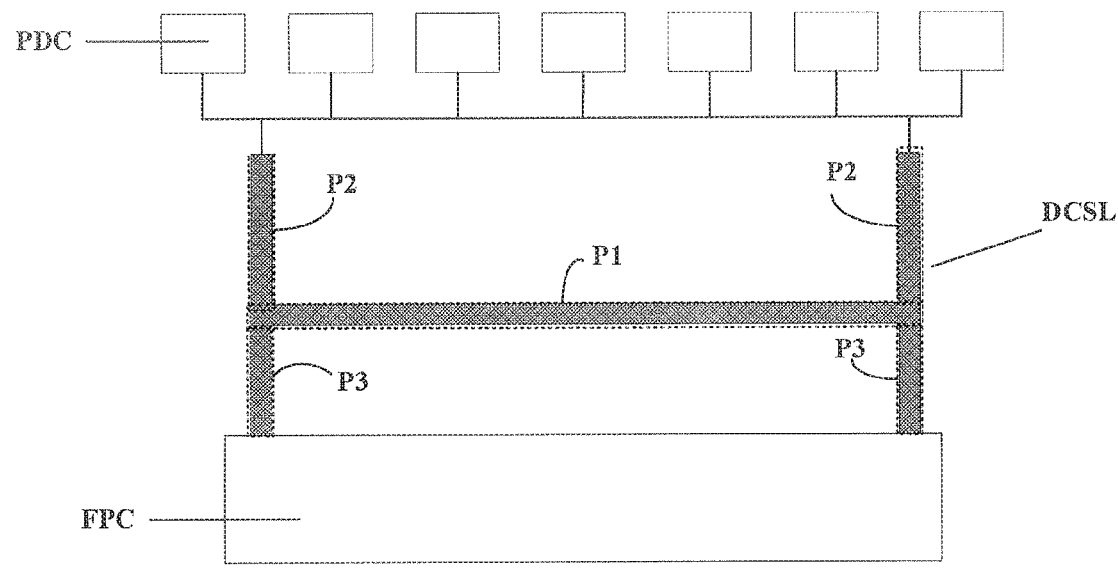
FIG. 6 is a schematic diagram of a structure of a direct current supply line in some embodiments according to the present disclosure.

FIG. 6 is a schematic diagram of a structure of a direct current supply line in some embodiments according to the present disclosure. In some embodiments, referring to FIG. 6, the first portion P1, the second portion P2, and the third portion P3 are commonly connected at a same point. Optionally, the second portion P2 and the third portion P3 are connected to form a linear line.

In some embodiments, referring to FIG. 3 to FIG. 6, the first portion P1 of the direct current supply line DCSL is in a region corresponding to the second fanout sub-part FP2. Optionally, the second portion P2 of the direct current supply line DCSL extends over a portion of the second fanout sub-part FP2, and extends through the bendable portion BP and a region corresponding to the first fanout sub-part FP1. Optionally, the third portion P3 extends through a region corresponding to the third fanout sub-part FP3 and extends over a portion of the second fanout sub-part FP2.

Optionally, the plurality of first signal lines SL1 extend through the first fanout sub-part FP1, the bendable portion BP, and the second fanout sub-part FP2. Optionally, the plurality of second signal lines SL2 extend through the third fanout sub-part FP3.

Optionally, a total number of the plurality of second signal lines SL2 is less than a total number of the plurality of first signal lines SL1. For example, a ratio of the total number of die plurality of second signal lines to the total number of the plurality of first signal lines is 1:N, wherein N≥2. Optionally, N=2.

In some embodiments, the direct current supply line is selected from a group consisting of a high voltage power supply line configured to provide a high voltage signal (e.g., $V_{DD}$) to the plurality of pixel driving circuits, a low voltage power supply line configured to provide a low voltage signal (e.g., $V_{SS}$) to the plurality of pixel driving circuits, and an initialization signal line configured to provide an initialization signal (e.g., Vinit) to the plurality of pixel driving circuits.

In some embodiments, referring to FIG. 4, the direct current supply line DCSL spaces apart the multiplexer MUX and the antenna AT. The electro-magnetic radiation signals emitted by the multiplexer MLA are absorbed by the direct current supply line DCSL having direction current transmitted therethrough, preventing the electro-magnetic radiation signals from propagating to the antenna AT and preventing the commination function of the antenna from being interrupted by the electro-magnetic radiation signal.

Figure 7:
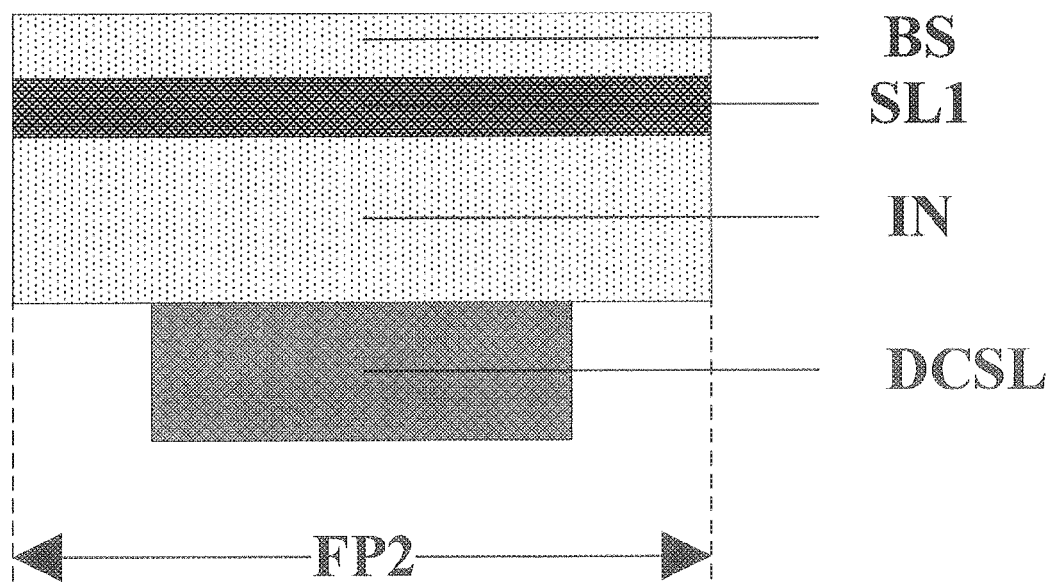
FIG. 7 is a cross-sectional zoom-in view of a second fanout sub-part along a B-B' line in FIG. 3.

FIG. 7 is a cross-sectional zoom-in view of a second fanout sub-part along a B-B' line in FIG. 3. In some embodiments, in the second fanout sub-part FP2, the plurality of first signal lines SL1 is on a base substrate BS, for example, the base substrate is a flexible and bendable base substrate. Optionally, the direct current supply line DCSL is on a side of the plurality of first signal lines SL1 away from the base substrate BS. Optionally, an insulating layer IN is between the plurality of first signal lines SU and the direct current supply line DCSL.

Figure 8:
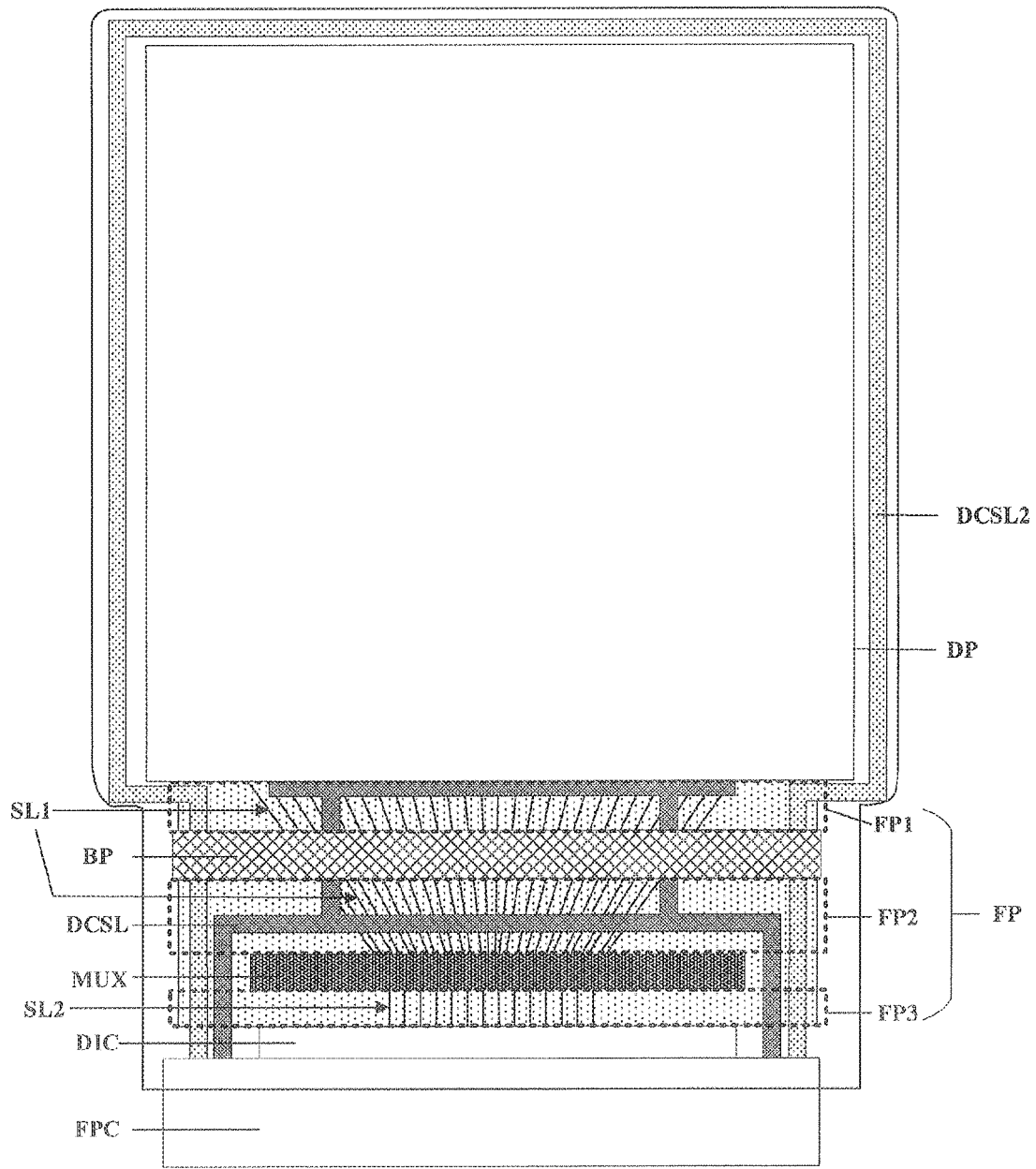
FIG. 8 is a schematic diagram of a structure of a display panel in some embodiments according to the present disclosure.

FIG. 8 is a schematic diagram of a structure of a display panel in some embodiments according to the present disclosure. In some embodiments, the display panel further includes a second direct current supply line DCSL2 electrically connected to the flexible printed circuit FPC. Optionally, the second direct current line DCSL2 has an open ring shape surrounding at least a portion of a perimeter of the display part DP. Optionally, the second direct current supply line DCSL2 is a low voltage power supply line configured to provide a low voltage signal $V_{SS}$) to the plurality of pixel driving circuits. Optionally, the second direct current supply line DCSL2 is electrically connected to the plurality of pixel driving circuits PDC, and is electrically connected to the flexible printed circuit FPC.

Figure 9:
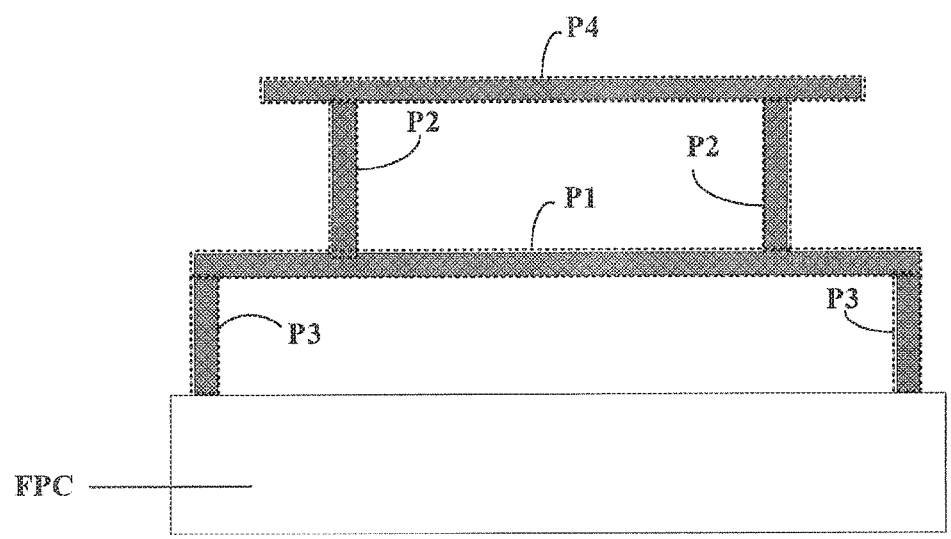
FIG. 9 is a schematic diagram of a structure of a direct current supply line in some embodiments according to the present disclosure.

FIG. 9 is a schematic diagram of a structure of a direct current supply line in some embodiments according to the present disclosure. In some embodiments, referring to FIG. 8 and FIG. 9, the direct current supply line DCSL further includes a fourth portion P4 in the first fanout sub-part FP1 and connected to the second portion P2 of the direct current supply line DCSL. Optionally, the fourth portion P4 crosses over the plurality of first signal lines SL1. Optionally, the first portion P1 is between the fourth portion P4 and the multiplexer MUX.

Accordingly, in some embodiments, the direct current supply line DCSL includes a first portion P1 and a fourth portion P4, the first portion P1 and the fourth portion P4 being spaced apart by the bendable portion BP. The first portion P1 crosses over the plurality of first signal lines SL1 in the second fanout sub-part FP2, and the fourth portion P4 crosses over the plurality of first signal lines SL1 in the first fanout sub-part FP1. The first portion P1 and the fourth portion P4 are connected through the second portion P2, which extends through the bendable portion BP.

Figure 10:
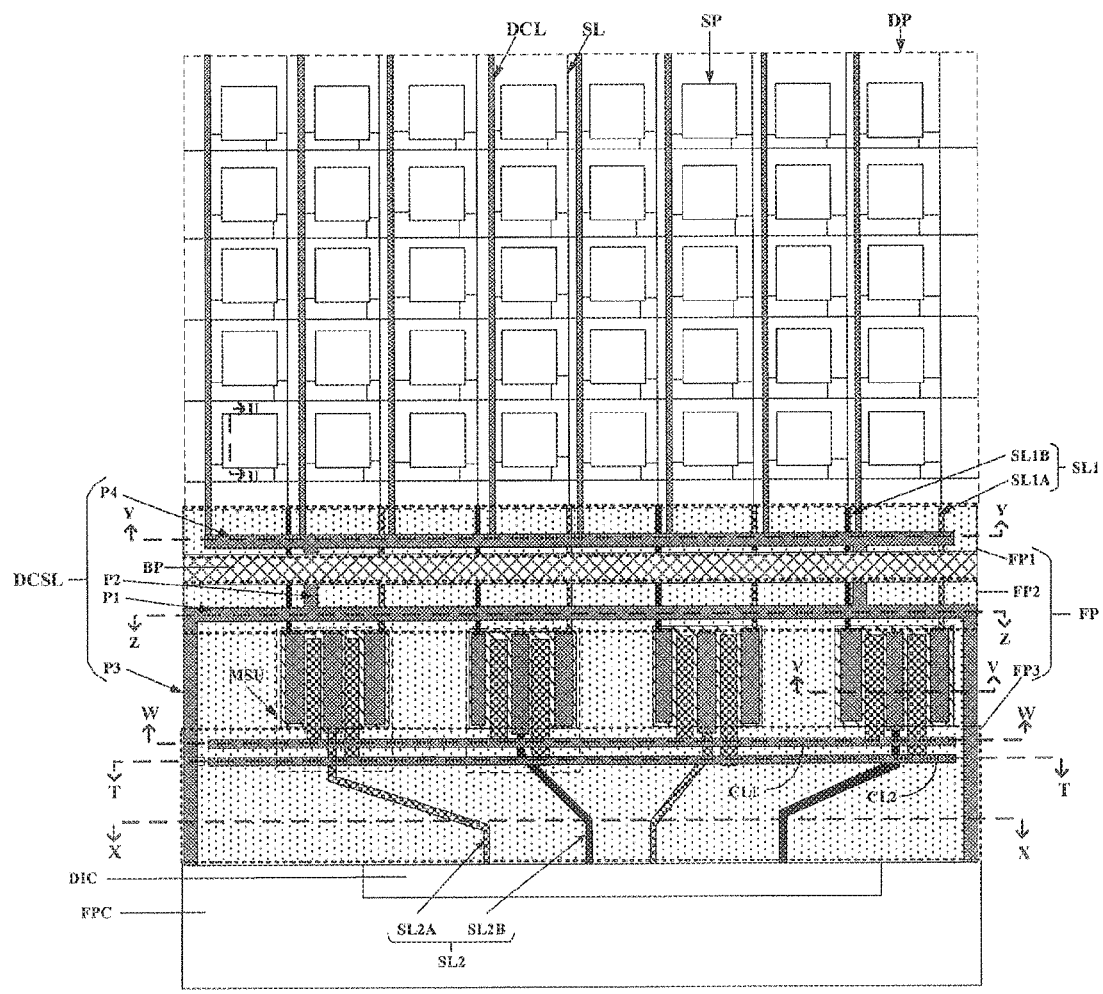
FIG. 10 is a schematic diagram of a structure of a display panel in some embodiments according to the present disclosure.

FIG. 10 is a schematic diagram of a structure of a display panel in some embodiments according to the present disclosure. In some embodiments, the display panel further includes a plurality of direct current lines DCL respectively connected to the direct current supply line DCSL. For example, the plurality of direction current lines DCL are respectively connected to the fourth part P4 of the direct current supply line DCSL. Optionally, the plurality of direct current lines DCL and the fourth part P4 of the direct current supply line DCSL are formed in a same layer and include a same material.

As used herein, the term "same layer" refers to the relationship between the layers simultaneously formed in the same step. In one example, the plurality of direction current lines DCL and the fourth part P4 of the direct current supply line DCSL are in a same layer when they are formed as a result of one or more steps of a same patterning process performed in a material deposited in a same deposition process. In another example, the plurality of direction current lines DCL and the fourth part P4 of the direct current supply line DCSL can be formed in a same layer by simultaneously performing the step of forming the active layer and the step of forming the first electrode. The term "same layer" does not always mean that the thickness of the layer or the height of the layer in a cross-sectional view is the same.

Optionally, the plurality of direction current lines DCL respectively extend along a direction from the fanout part FP to the display part DP to respectively connect to a column of a plurality of subpixels SP in the display part DP. Optionally, a direct current is provided from the direct current supply line DCSL to the plurality of direct current lines DCL. For example, the direct current supply line DCSL is a high voltage power supply line, and plurality of the direct current lines DCL are a plurality of high voltage line, a high voltage is provided from the direct current supply line DCSL to the plurality of direct current lines DCL.

Figure 11:
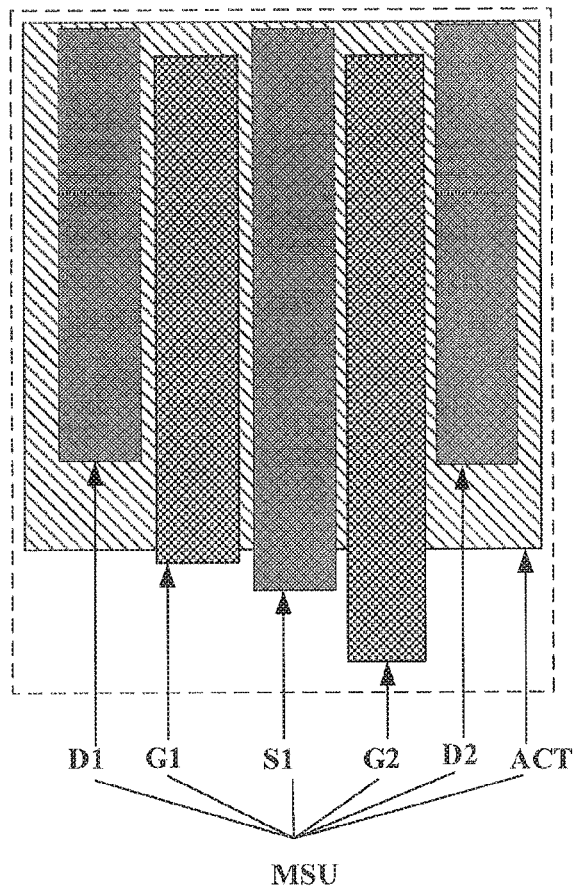
FIG. 11 is a schematic diagram of a structure of a respective one of a plurality of multiplexer sub-units in some embodiments according to the present disclosure.

FIG. 11 is a schematic diagram of a structure of a respective one of a plurality of multiplexer sub-units in some embodiments according to the present disclosure. In some embodiments, referring to FIG. 10 and FIG. 11, the multiplexer MUX includes a plurality of multiplexer sub-units MSU. Optionally, a respective one of the plurality of multiplexer sub-units MSU includes a first source electrode S1, a first gate electrode G1, a first drain electrode D1, a second gate electrode G2, a second drain electrode D2, and an active layer ACT.

Optionally, the first source electrode S1, the first drain electrode D1, and the second drain electrode D2 are in a same layer and include a same material. Optionally, the first gate electrode G1 and the second gate electrode G2 are in a same layer and include a same material.

Figure 12:
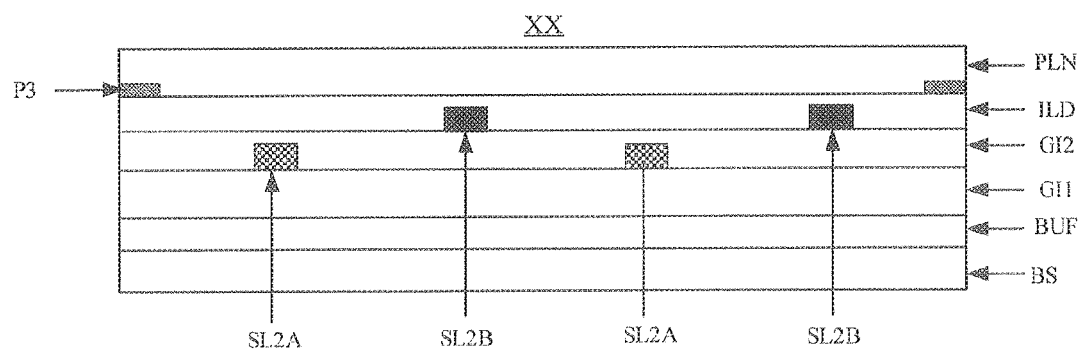
FIG. 12 is a cross-sectional view of a display panel along a XX line in FIG. 10.

FIG. 12 is a cross-sectional view of a display panel along a XX line in FIG. 10. In some embodiments, referring to FIG. 10 and FIG. 12, the plurality of second signal lines SL2 includes a plurality of first type second signal lines SL2A and a plurality of second type second signal lines SL2B. Optionally, orthographic projections of the plurality of first type second signal lines SL2A on the base substrate BS and orthographic projections of the plurality of second type second signal lines SL2B on the base substrate BS are alternately arranged. Optionally, the plurality of first type second signal lines SL2A are in a layer different from a layer where the plurality of second type second signal lines SL2B are.

Figure 13:
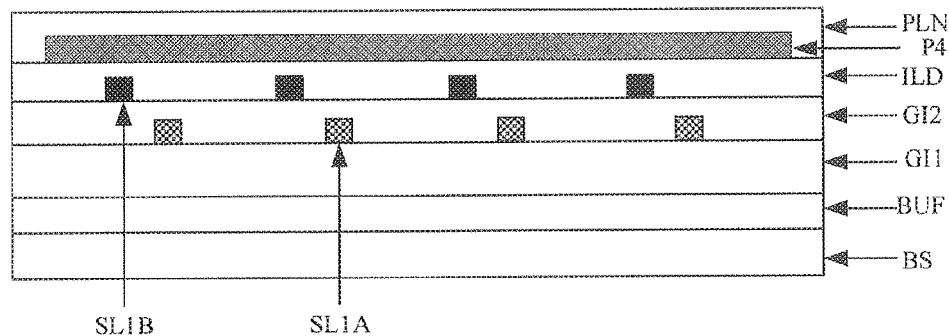
FIG. 13 is a cross-sectional view of a display panel along a YY line in FIG. 10.

FIG. 13 is a cross-sectional view of a display panel along a YY line in FIG. 10. In some embodiments, referring to FIG. 10 and FIG. 13, the plurality of first signal lines SL1 include a plurality of first type first signal lines SL1A and a plurality of second type first signal lines SL1B. Optionally, the plurality of first signal lines SL1 are respectively connected to a plurality of signal lines SL extending from the fanout part FP to the display part DP. Optionally, signals are provided from the plurality of first signal lines SL1 respectively to the plurality of signal lines SL, and are provided from the plurality of signal lines SL respectively to the plurality of subpixels in the display part DP. For example, the plurality of signal lines SL are a plurality of data lines, and the plurality of first signal lines SL1 are a plurality of fanout lines.

Optionally, orthographic projections of the plurality of first type first signal lines SL1A on the base substrate BS and orthographic projections of the plurality of second type first signal lines SL1B on the base substrate BS are alternately arranged. Optionally, the plurality of first type first signal lines SL1A are in a layer different from the layer where the plurality of second type first signal lines SL1B are. Optionally, the fourth portion P4, the plurality of first type first signal lines SL1A, and the plurality of second type first signal lines SL1B are in different layers.

Optionally, referring to FIG. 10, FIG. 12, and FIG. 13, the plurality of first type second signal lines SL2A and the plurality of first type first signal lines SL1A are in a same layer, and the plurality of second type second signal lines SL2B and the plurality of second type first signal lines SL1B are in a same layer and include a same material.

Figure 14:
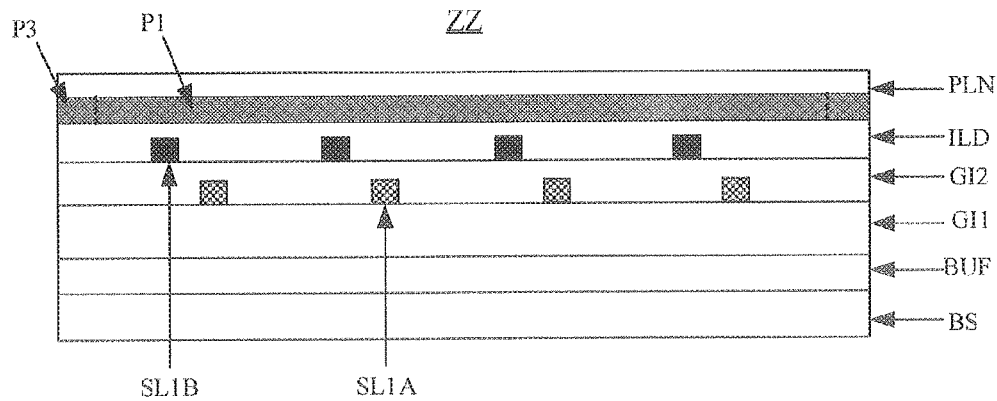
FIG. 14 is a cross-sectional view of a display panel along a ZZ line in FIG. 10.

FIG. 14 is a cross-sectional view of a display panel along a ZZ line in FIG. 10. In some embodiments, referring to FIG. 10 and FIG. 14, the third portion P3 and the first portion P1 of the direct current supply line DCSL are in a same layer and include a same material. Optionally, the first portion P1, the second portion P2, the third portion P3, and the fourth portion P4 are in a same layer and include a same material.

Figure 15:
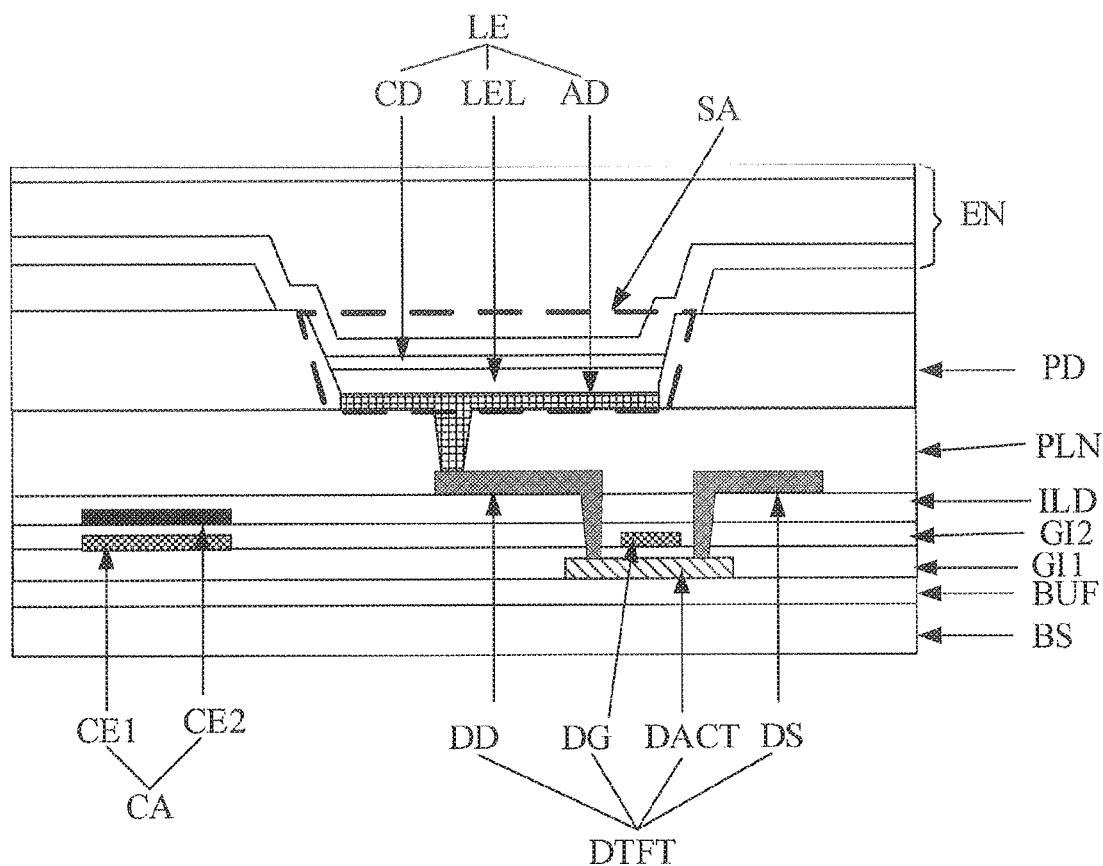
FIG. 15 is a cross-sectional view of a display panel along a UU line in FIG. 10.

FIG. 15 is a cross-sectional view of a display panel along a UU line in FIG. 10. In some embodiments, referring to FIG. 10 and FIG. 15, the display panel further includes a plurality of driving thin film transistors DTFT, a plurality of capacitors CA, and a plurality of light emitting elements LE. Optionally, a respective one of the plurality of driving thin film transistors DTFT includes a driving active layer DACT, a driving source electrode DS, a driving drain electrode DD, and a driving gate electrode DG. Optionally, a respective one of the plurality of capacitors CA includes a first capacitor electrode CE1, a second capacitor electrode CE2, and a second gate insulating layer GI2 insulating the first capacitor electrode CE1 from the second capacitor electrode CE2. Optionally, a respective one of the plurality of light emitting elements LE includes an anode AD, a cathode CD and a light emitting layer LEL between the anode AD and the cathode CD.

In some embodiments, referring to FIG. 15, a buffer layer BUF is on the base substrate BS. The driving active layer DACT is on a side of the buffer layer BUF away from the base substrate BS. A first gate insulating layer GI1 is on a side of the driving active layer DACT away from the buffer layer BUF. The first capacitor electrode CE1 and the driving gate electrode DG are on a side of the first gate insulating layer GI1 away from the driving active layer DACT. A second gate insulating layer GI2 is on a side of the first capacitor electrode CE1 and the driving gate electrode DG away from the first gate insulating layer GI1. The second capacitor electrode CE2 is on a side of the second gate insulating layer GI2 away from the first capacitor electrode CE1 and the driving gate electrode DG. An inter-layer dielectric layer ILD is on a side of the second capacitor electrode CE2 away from the second gate insulating layer GI2. The driving source electrode DS and the driving drain electrode DD are on a side of the inter-layer dielectric layer RD away from the second capacitor electrode CE2. The driving source electrode DS and the driving drain electrode DID respectively extend through the inter-layer dielectric layer ILD, the second gate insulating layer GI2, and the first gate insulating layer GI1, to connect to the driving active layer DACT. A planarization layer PLN is on a side of the driving source electrode DS and the driving drain electrode DD away from the inter-layer dielectric layer ILD. A pixel definition layer PD is on a side of the planarization layer PLN away from the driving source electrode DS and the driving drain electrode DD to define a plurality of subpixel aperture SA. The plurality of light emitting elements LE are respectively formed in the plurality of subpixel aperture SA. An encapsulating layer EN is on a side of the plurality of light emitting elements LE away from the base substrate BS and configured to encapsulate the plurality of light emitting elements LE.

Referring to FIG. 10 and FIG. 15, optionally, the first capacitor electrode CE1, the driving gate electrode DG, the plurality of first type first signal lines SL1A, and the plurality of first type second signal lines SL2A are in a same layer and include a same material. Optionally, the second capacitor electrode CE2, the plurality of second type first signal lines SL1B, and the plurality of second type second signal lines SL2B are in a same layer and include a same material. Optionally, the driving source electrode DS, the driving drain electrode DD, the first portion P1, the second portion P2, the third portion P3, and the fourth portion P4 are in a same layer and include a same material.

Figure 16:
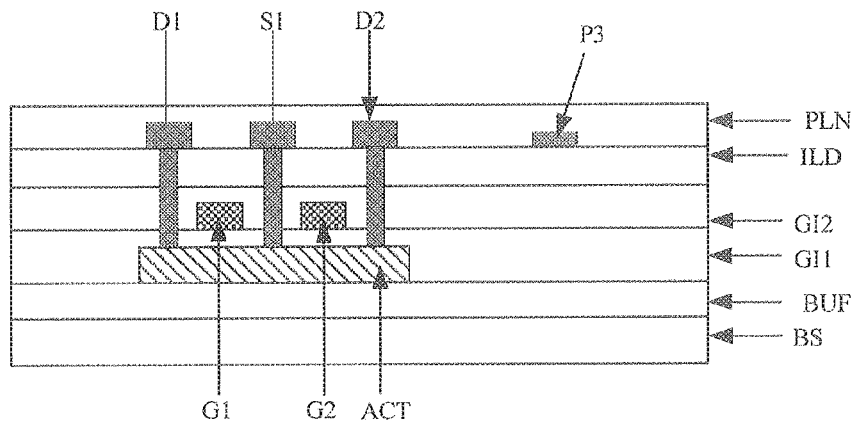
FIG. 16 is a cross-sectional view of a display panel along a VV line in FIG. 10.

FIG. 16 is a cross-sectional view of a display panel along a VV line in FIG. 10, in some embodiments, referring to FIG. 10, FIG. 11, and FIG. 16, the active layer ACT is on a side of the buffer layer BUF away from the base substrate BS. Optionally, the active layer ACT and the driving active layer DACT are in the same layer and include a same material.

Optionally, the first gate electrode G1 and the second gate electrode G2 are on a side of the first gate insulating layer GI1 away from the active layer ACT. Optionally, the first gate electrode G1 and the second gate electrode G2 are in a same layer and include a same material. Optionally, the first capacitor electrode CE1, the driving gate electrode DG, the first gate electrode G1, the second gate electrode G2, the plurality of first type first signal lines SL1A, and the plurality of first type second signal lines SL2A are in a same layer and include a same material.

Optionally, the first source electrode S1, the first drain electrode D1, and the second drain electrode D2 are on a side of the inter-layer dielectric layer ILD away from the first gate electrode G1 and the second gate electrode G2. Optionally, the first source electrode S1 is between the first drain electrode D1, the second drain electrode D2. Optionally, the first source electrode S1, the first drain electrode D1, and the second drain electrode D2 respectively extend through the inter-layer dielectric layer ILD, the second gate insulating layer GI2, and the first gate insulating layer GI1 to connect to the active layer ACT.

Optionally, the first source electrode S1, the first drain electrode D1, and the second drain electrode D2 are in a same layer and include a same material. Optionally, the first source electrode S1, the first drain electrode D1, the second drain electrode D2, the driving source electrode DS, the driving drain electrode DD, the first portion P1, the second portion P2, the third portion P3, and the fourth portion P4 are in a same layer and include a same material.

Optionally, the respective one of the plurality of multiplexer sub-units MSU is connected to a pair of first signal lines including a respective one of the plurality of first type first signal line SL1A and a respective one of the plurality of second type first signal line SL1B through vias. Optionally, the second drain electrode D2 of the respective one of the plurality of multiplexer sub-units MSU is connected to the respective one of the plurality of first type first signal lines SL1A, and the first drain electrode D1 of the respective one of the plurality of multiplexer sub-units MSU is connected to the respective one of the plurality of second type first signal lines SL1B.

Optionally, the first source electrode S1 of the respective one of the plurality of multiplexer sub-units MSU are connected to the respective one of the plurality of second signal lines SL2 through a via.

Figure 17:
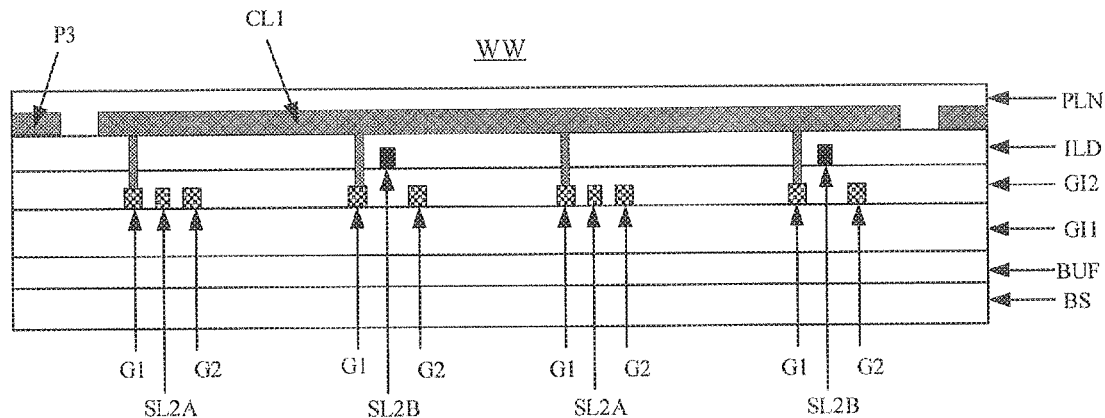
FIG. 17 is a cross-sectional view of a display panel along a WW line in FIG. 10.

FIG. 17 is a cross-sectional view of a display panel along a WW line in FIG. 10. In some embodiments, referring to FIG. 10, FIG. 11, FIG. 16, and FIG. 17, the display panel further includes a first control line CL1 crossing over the plurality of second signal lines SL2. Optionally, the first gate electrode G1 and the first control line CL1 are in different layers, and the first gate electrode G1 is connected to the first control line CL1 through a via. Optionally, the first control line CL1, the first portion P1, the second portion P2, the third portion P3, and the fourth portion P4 are in a same layer and include a same material.

Figure 18:
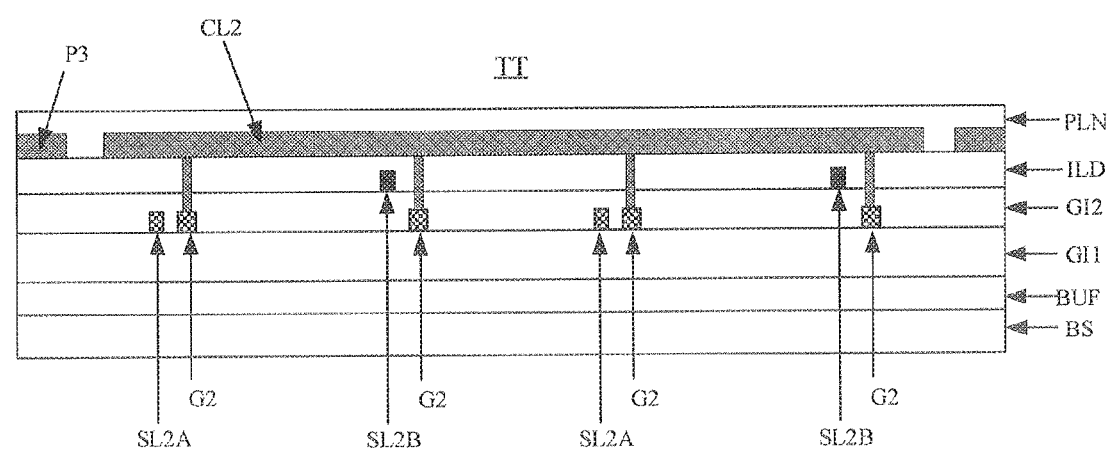
FIG. 18 is a cross-sectional view of a display panel along a TT line in FIG. 10.

FIG. 18 is a cross-sectional view of a display panel along a TT line in FIG. 10. In some embodiments, referring to FIG. 10, FIG. 11, FIG. 16, FIG. 17, and FIG. 18, the display panel further includes a second control line CL2 crossing over the plurality of second signal lines SL2. Optionally, the second gate electrode G2 and the second control line CL2 are in different layers, and the second gate electrode G2 is connected to the second control line CL2 through a via. Optionally, the second control line CL2, the first portion P1, the second portion P2, the third portion P3, and the fourth portion P4 are in a same layer and include a same material.

Optionally, the first control line CL1 and the second control line CL2 are in a same layer and include a same material. Optionally, the first control line CL1, the second control line CL2, the first source electrode S1, the first drain electrode D1, the second drain electrode D2, the first portion P1, the second portion P2, the third portion P3, and the fourth portion P4 are in a same layer and include a same material.

The first control line CL1 and the second control line CL2 respectively controls a respective one of the plurality of first type first signal lines SL1A and a respective one of the plurality of second type first signal lines SL1B connected to a respective one of the plurality of multiplexer sub-units MSU to receive a data signal from a respective one of the plurality of second signal lines SL2 connected to the respective one of the plurality of multiplexer sub-units MSU. For example, in a first time period, the first control line CL1 is configured to turn on the first gate electrode G1 to allow a first data signal to transmit from the first source electrode S1 to the first drain electrode D1 while the second control line CL2 is configured to turn off the second gate electrode G2 to prohibit the first data signal to transmit from the first source electrode S1 to the second drain electrode D2. Accordingly, in the first time period, the respective one of the plurality of second type first signal lines SL1B connected to the respective one of the plurality of multiplexer sub-units MSU is configured to receive the first data signal from the respective one of the plurality of second signal lines SL2 connected to the respective one of the plurality of multiplexer sub-units MSU. Similarly, in a second time period, the second control line CL2 is configured to turn on the second gate electrode G2 to allow a second data signal to transmit from the first source electrode S1 to the second drain electrode D2 while the first control line CL1 is configured to turn off the first gate electrode G1 to prohibit the second data signal to transmit from the first source electrode S1 to the first drain electrode D1. Accordingly, in the second time period, the respective one of the plurality of first type first signal lines SL1A connected to the respective one of the plurality of multiplexer sub-units MSU is configured to receive the second data signal from the respective one of the plurality of second signal lines SL2 connected to the respective one of the plurality of multiplexer sub-units MSU.

In another aspect, the present disclosure provides a display apparatus. In some embodiments, the display apparatus includes the display panel described herein and one or more integrated circuits connected to the display panel. Optionally, the display apparatus includes a flexible printed circuit electrically connected to the driving integrated circuit. Optionally, the flexible printed circuit is electrically connected to the direct current supply line, and configured to provide a direct current to the direct current supply line. Optionally, the flexible printed circuit is electrically connected to the second direct current supply line, and configured to provide a second direct current to the second direct current supply line.

In another aspect, the present disclosure provides a method of preventing electro-magnetic interference in a display panel. In some embodiments, referring to FIG. 3, the display panel includes a display part DP and a fanout part FP. Optionally, the display part DP includes a plurality of pixel driving circuits PDC. Optionally, the fanout part FP includes a bendable portion BP; and a multiplexer MUX. Optionally, the display panel includes a plurality of first signal lines SL1 extending through the bendable portion BP, and connecting the plurality of pixel driving circuits PDC to the multiplexer MUX; and a direct current supply line DCSL extending through the bendable portion BP and electrically connected to the plurality of pixel driving circuits PDC. Optionally, a portion of the direct current supply line DCSL is between the multiplexer MUX and the bendable portion BP and crosses over the plurality of first signal lines SL1.

In some embodiments, the method of preventing electro-magnetic interference includes providing a direct current signal to the direct current supply line DCSL to prevent electromagnetic radiation signals emitted from the multiplexer MUX from transmitting to the bendable portion BP.

In some embodiments, the direct current signal is selected from a group consisting of a high voltage signal (e.g., $V_{DD}$) provided to the plurality of pixel driving circuits PDC, a low voltage signal (e.g., $V_{SS}$) provided to the plurality of pixel driving circuits PDC, and an initialization signal (e.g., Vinit) provided to the plurality of pixel driving circuits PDC; and the direct current supply line DCSL is selected from a group consisting of a high voltage power supply line configured to provide the high voltage signal to the plurality of pixel driving circuits PDC, a low voltage power supply line configured to provide the low voltage signal to the plurality of pixel driving circuits PDC, and an initialization signal line configured to provide the initialization signal to the plurality of pixel driving circuits PDC.

In some embodiments, referring to FIG. 3 and FIG. 4, the display panel further includes an antenna AT. Optionally, the direct current supply line DCSL spaces apart the multiplexer MUX and the antenna AT. Optionally, providing the direct current signal to the direct current supply line DCSL prevents the electromagnetic radiation signals emitted from the multiplexer MUX from transmitting to the antenna AT.

In another aspect, the method of fabricating a display panel includes forming a plurality of pixel driving circuits in a display part; forming a bendable portion in a fanout part; forming a multiplexer in the fanout part; and forming a plurality of first signal lines extending through the bendable portion, and connecting the plurality of pixel driving circuits to the multiplexer; forming a direct current supply line extending through the bendable portion and be electrically connected to the plurality of pixel driving circuits. Optionally, a portion of the direct current supply line is formed between the multiplexer and the bendable portion and crossing over the plurality of first signal lines.

In some embodiments, the method of fabricating the display panel includes forming an antenna. Optionally, the antenna is formed at a position spaced apart from the multiplexer by the direct current supply line.

In some embodiments, the fanout part is formed to have a first fanout sub-part abutting the display part. Optionally, the bendable portion is formed to be connected to the first fallout sub-part, and spaced apart from the display part by the first fanout sub-part.

In some embodiments, the fanout part is formed to have a second fallout sub-part connected to the bendable portion and spaced apart from the first fanout sub-part by the bendable portion. Optionally, the multiplexer is formed to be connected to the second fanout sub-part and spaced apart from the bendable portion by the second fanout sub-part.

In some embodiments, the fanout part is formed to having a third fanout sub-part connected to the multiplexer and spaced apart from the second fanout sub-part by the multiplexer. Optionally, the method of fabricating the display panel includes forming a driving integrated circuit. Optionally, the method of fabricating the display panel includes forming a plurality of second signal lines extending through the third fanout sub-part, and connecting the multiplexer to the driving integrated circuit.

In some embodiments, forming the direct currently supply line includes forming a first portion, a second portion, and a third portion. Optionally, the first portion is formed to cross over the plurality of first signal lines. Optionally, the second portion is formed to extend from the first portion through the bendable portion to electrically connect to the plurality of pixel driving circuits. Optionally, the third portion is formed to connects the first portion to a flexible printed circuit.

In some embodiments, the first portion of the direct current supply line is formed in the second fanout sub-part. Optionally, the second portion of the direct current supply line is formed to extend over a portion of the second fanout sub-part, and extend through the bendable portion and the first fanout sub-part. Optionally, the plurality of first signal lines are formed to extend through the first fanout sub-part, the bendable portion, and the second fanout sub-part.

In some embodiments, a total number of the plurality of second signal lines is less than a total number of the plurality of first signal lines. For example, a ratio of the total number of the plurality of second signal lines to the total number of the plurality of first signal lines is ½.

In some embodiments, the direct current supply line is formed using one line selected from a group consisting of a high voltage power supply line configured to provide a high voltage signal to the plurality of pixel driving circuits, a low voltage power supply line configured to provide a low voltage signal to the plurality of pixel driving circuits, and an initialization signal line configured to provide an initialization signal to the plurality of pixel driving circuits.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel, comprising:
    a display part; and
    a fanout part;
    wherein the display part comprises a plurality of pixel driving circuits;
    the fanout part comprises a bendable portion and a multiplexer;
    wherein the display panel comprises a plurality of first signal lines extending through the bendable portion, and connecting the plurality of pixel driving circuits to the multiplexer; and
    a direct current supply line extending through the bendable portion and electrically connected to the plurality of pixel driving circuits; and
    wherein a portion of the direct current supply line is between the multiplexer and the bendable portion and crosses over the plurality of first signal lines;
    wherein the fanout part comprises:
    a first fanout sub-part abutting the display part;
    the bendable portion connected to the first fanout sub-part and spaced apart from the display part by the first fanout sub-part;
    a second fanout sub-part connected to the bendable portion and spaced apart from the first fanout sub-part by the bendable portion; and
    the multiplexer connected to the second fanout sub-part and spaced apart from the bendable portion by the second fanout sub-part;
    wherein the display panel further comprises a driving integrated circuit;
    wherein the fanout part further comprises:
    a third fanout sub-part connected to the multiplexer and spaced apart from the second fanout sub-part by the multiplexer; and
    wherein the display panel comprises a plurality of second signal lines extending through the third fanout sub-part, and connecting the multiplexer to the driving integrated circuit;

wherein the direct current supply line comprises a first portion, a second portion, and a third portion;

the first portion crosses over the plurality of first signal lines;

the second portion extends from the first portion through the bendable portion to electrically connect to the plurality of pixel driving circuits; and the third portion connects the first portion to a flexible printed circuit;

wherein the display panel further comprises:

a plurality of driving thin film transistor respectively in a plurality of subpixels in the display part; and a plurality of capacitors respectively in the plurality of subpixels in the display part;

wherein a respective one of the plurality of driving thin film transistors comprises a driving active layer, a driving source electrode, a driving drain electrode, and a driving gate electrode; and the driving source electrode, the driving drain electrode, the first portion, the second portion, and the third portion are in a same layer and comprise a same material;

wherein a respective one of the plurality of capacitors comprises a first capacitor electrode, a second capacitor electrode, and an insulating layer insulating the first capacitor electrode from the second capacitor electrode;

wherein the plurality of first signal lines comprises a plurality of first type first signal lines and a plurality of second type first signal lines;

orthographic projections of the plurality of first type first signal lines on a base substrate and orthographic projections of the plurality of second type first signal lines on the base substrate are alternately arranged;

the first capacitor electrode, the driving gate electrode, and the plurality of first type first signal lines are in a same layer and comprise a same material; and the second capacitor electrode, and the plurality of second type first signal lines are in a same layer and comprise a same material.

2. The display panel of claim 1, wherein the first portion of the direct current supply line is in a region corresponding to the second fanout sub-part;

the second portion of the direct current supply line extends over a portion of the second fanout sub-part, and extends through the bendable portion and a region corresponding to the first fanout sub-part; and the plurality of first signal lines extend through the first fanout sub-part, the bendable portion, and the second fanout sub-part.

3. The display panel of claim 1, wherein a total number of the plurality of second signal lines is less than a total number of the plurality of first signal lines.

4. The display panel of claim 1, wherein the direct current supply line is selected from a group consisting of a high voltage power supply line configured to provide a high voltage signal to the plurality of pixel driving circuits, a low voltage power supply line configured to provide a low voltage signal to the plurality of pixel driving circuits, and an initialization signal line configured to provide an initialization signal to the plurality of pixel driving circuits.

5. The display panel of claim 1, further comprising an antenna;

wherein the direct current supply line spaces apart the multiplexer and the antenna.

6. The display panel of claim 1, wherein the plurality of second signal lines comprise a plurality of first type second signal lines and a plurality of second type second signal lines;

orthographic projections of the plurality of first type second signal lines on the base substrate and orthographic projections of the plurality of second type second signal lines on the base substrate are alternately arranged;

the first capacitor electrode, the driving gate electrode, the plurality of first type first signal lines, and the plurality of first type second signal lines are in a same layer and comprise a same material; and the second capacitor electrode, the plurality of second type first signal lines, and the plurality of second type second signal lines are in a same layer and comprise a same material.

7. The display panel of claim 6, wherein the multiplexer comprises a plurality of multiplexer sub-units;

a respective one of the plurality of multiplexer sub-units comprises a first source electrode, a first gate electrode, a first drain electrode, a second gate electrode, a second drain electrode, and an active layer;

the first source electrode, the first drain electrode, the second drain electrode, the driving source electrode, the driving drain electrode, the first portion, the second portion, and the third portion are in a same layer and comprise a same material; and the first gate electrode, the second gate electrode, and the driving gate electrode are in a same layer and comprise a same material.

8. The display panel of claim 1, wherein the direct current supply line further comprises a fourth portion in the first fanout sub-part;

the first portion is between the fourth portion and the multiplexer;

the first portion and the fourth portion are spaced apart by the bendable portion;

the first portion crosses over the plurality of first signal lines in the second fanout sub-part; and the fourth portion crosses over the plurality of first signal lines in the first fanout sub-part.

9. The display panel of claim 8, further comprising a plurality of direct current lines respectively connected to the fourth portion;

wherein the plurality of direction current lines respectively extend along a direction from the fanout part to the display part to respectively connect to a column of a plurality of subpixels in the display part; and the first portion, the second portion, the third portion, the fourth portion and the plurality of direct current lines are in a same layer and comprise a same material.

10. A display apparatus, comprising the display panel of claim 1, and one or more integrated circuits connected to the display panel.

11. A method of preventing electro-magnetic interference in a display panel;

wherein the display panel comprises a display part and a fanout part;

wherein the display part comprises a plurality of pixel driving circuits;

the fanout part comprises a bendable portion and a multiplexer;

wherein the display panel comprises a plurality of first signal lines extending through the bendable portion, and connecting the plurality of pixel driving circuits to the multiplexer; and a direct current supply line extending through the bendable portion and electrically connected to the plurality of pixel driving circuits;
wherein a portion of the direct current supply line is between the multiplexer and the bendable portion and crosses over the plurality of first signal lines;
wherein the fanout part comprises:
a first fanout sub-part abutting the display part;
the bendable portion connected to the first fanout sub-part and spaced apart from the display part by the first fanout sub-part;
a second fanout sub-part connected to the bendable portion and spaced apart from the first fanout sub-part by the bendable portion; and
the multiplexer connected to the second fanout sub-part and spaced apart from the bendable portion by the second fanout sub-part;
wherein the display panel further comprises a driving integrated circuit;
wherein the fanout part further comprises:
a third fanout sub-part connected to the multiplexer and spaced apart from the second fanout sub-part by the multiplexer; and
wherein the display panel comprises a plurality of second signal lines extending through the third fanout sub-part, and connecting the multiplexer to the driving integrated circuit;
wherein the direct current supply line comprises a first portion, a second portion, and a third portion;
the first portion crosses over the plurality of first signal lines;
the second portion extends from the first portion through the bendable portion to electrically connect to the plurality of pixel driving circuits; and
the third portion connects the first portion to a flexible printed circuit;
wherein the display panel further comprises:
a plurality of driving thin film transistor respectively in a plurality of subpixels in the display part; and
a plurality of capacitors respectively in the plurality of subpixels in the display part;
wherein a respective one of the plurality of driving thin film transistors comprises a driving active layer, a driving source electrode, a driving drain electrode, and a driving gate electrode; and
the driving source electrode, the driving drain electrode, the first portion, the second portion, and the third portion are in a same layer and comprise a same material;
wherein a respective one of the plurality of capacitors comprises a first capacitor electrode, a second capacitor electrode, and an insulating layer insulating the first capacitor electrode from the second capacitor electrode;
wherein the plurality of first signal lines comprises a plurality of first type first signal lines and a plurality of second type first signal lines;
orthographic projections of the plurality of first type first signal lines on a base substrate and orthographic projections of the plurality of second type first signal lines on the base substrate are alternately arranged;
the first capacitor electrode, the driving gate electrode, and the plurality of first type first signal lines are in a same layer and comprise a same material; and
the second capacitor electrode, and the plurality of second type first signal lines are in a same layer and comprise a same material;

wherein the method of preventing electro-magnetic interference comprises providing a direct current signal to the direct current supply line to prevent electromagnetic radiation signals emitted from the multiplexer from transmitting to the bendable portion.

12. The method of claim 11, wherein the direct current signal is selected from a group consisting of a high voltage signal provided to the plurality of pixel driving circuits, a low voltage signal provided to the plurality of pixel driving circuits, and an initialization signal provided to the plurality of pixel driving circuits; and
the direct current supply line is selected from a group consisting of a high voltage power supply line configured to provide the high voltage signal to the plurality of pixel driving circuits, a low voltage power supply line configured to provide the low voltage signal to the plurality of pixel driving circuits, and an initialization signal line configured to provide the initialization signal to the plurality of pixel driving circuits.

13. The method of claim 12, wherein the display panel further comprises an antenna;
wherein the direct current supply line spaces apart the multiplexer and the antenna; and
providing the direct current signal to the direct current supply line prevents the electromagnetic radiation signals emitted from the multiplexer from transmitting to the antenna.

14. A method of fabricating a display panel, comprising:
forming a plurality of pixel driving circuits in a display part;
forming a bendable portion in a fanout part;
forming a multiplexer in the fanout part;
forming a plurality of first signal lines extending through the bendable portion, and connecting the plurality of pixel driving circuits to the multiplexer; and
forming a direct current supply line extending through the bendable portion and be electrically connected to the plurality of pixel driving circuits;
wherein a portion of the direct current supply line is formed between the multiplexer and the bendable portion and crossing over the plurality of first signal lines;
wherein forming the fanout part comprises:
forming a first fanout sub-part abutting the display part;
forming the bendable portion connected to the first fanout sub-part and spaced apart from the display part by the first fanout sub-part;
forming a second fanout sub-part connected to the bendable portion and spaced apart from the first fanout sub-part by the bendable portion; and
forming the multiplexer connected to the second fanout sub-part and spaced apart from the bendable portion by the second fanout sub-part;
wherein the method further comprises forming a driving integrated circuit;
wherein forming the fanout part further comprises:
forming a third fanout sub-part connected to the multiplexer and spaced apart from the second fanout sub-part by the multiplexer; and
wherein the method comprises forming a plurality of second signal lines extending through the third fanout sub-part, and connecting the multiplexer to the driving integrated circuit;
wherein forming the direct current supply line comprises forming a first portion, forming a second portion, and forming a third portion;
the first portion crosses over the plurality of first signal lines;

the second portion extends from the first portion through the bendable portion to electrically connect to the plurality of pixel driving circuits; and the third portion connects the first portion to a flexible printed circuit;

wherein the method further comprises:

forming a plurality of driving thin film transistor respectively in a plurality of subpixels in the display part; and forming a plurality of capacitors respectively in the plurality of subpixels in the display part;

wherein forming a respective one of the plurality of driving thin film transistors comprises forming a driving active layer, forming a driving source electrode, forming a driving drain electrode, and forming a driving gate electrode; and the driving source electrode, the driving drain electrode, the first portion, the second portion, and the third portion are formed in a same layer and comprise a same material;

wherein forming a respective one of the plurality of capacitors comprises forming a first capacitor electrode, forming a second capacitor electrode, and forming an insulating layer insulating the first capacitor electrode from the second capacitor electrode;

wherein forming the plurality of first signal lines comprises forming a plurality of first type first signal lines and forming a plurality of second type first signal lines;

orthographic projections of the plurality of first type first signal lines on a base substrate and orthographic projections of the plurality of second type first signal lines on the base substrate are alternately arranged;

the first capacitor electrode, the driving gate electrode, and the plurality of first type first signal lines are formed in a same layer and comprise a same material; and the second capacitor electrode, and the plurality of second type first signal lines are formed in a same layer and comprise a same material.

15. The method of claim 14, further comprising forming an antenna;

wherein the antenna is formed at a position spaced apart from the multiplexer by the direct current supply line.

* * * * *

UNITED STATES PATENT AND TRADEMARK OFFICE
CERTIFICATE OF CORRECTION

PATENT NO. : 11,706,958 B2  
APPLICATION NO. : 17/047914  
DATED : July 18, 2023  
INVENTOR(S) : Qing et al.

Page 1 of 1

It is certified that error appears in the above-identified patent and that said Letters Patent is hereby corrected as shown below:

On the Title Page

In item (73) Assignees, please correct the assignees to read as follows:  
Chengdu BOE Optoelectronics Technology Co., Ltd., Sichuan (CN); BOE Technology Group Co., Ltd., Beijing (CN)

Signed and Sealed this  
Twenty-sixth Day of September, 2023

Katherine Kelly Vidal  
*Director of the United States Patent and Trademark Office*